(12) United States Patent
Hwang et al.

(10) Patent No.: US 10,673,269 B2
(45) Date of Patent: Jun. 2, 2020

(54) MAGNETIC FIELD SHIELDING UNIT (71) Applicant: Amosense Co., Ltd., Cheonan-si (KR)

(72) Inventors: Seung Jae Hwang, Incheon (KR); Kil Jae Jang, Seongnam-si (KR)

(73) Assignee: Amosense Co., Ltd., Cheonan-si (KR)

( * ) Notice: Subject to any disclaimer, the term of this patent is extended or adjusted under 35 U.S.C. 154(b) by 183 days.

(21) Appl. No.: 15/745,444

(22) PCT Filed: Jul. 14, 2016

(86) PCT No.: PCT/KR2016/007680
§ 371 (c)(1),
(2) Date: Jan. 17, 2018

(87) PCT Pub. No.: WO2017/014493
PCT Pub. Date: Jan. 26, 2017

(65) Prior Publication Data
US 2018/0198305 A1    Jul. 12, 2018

(30) Foreign Application Priority Data

Jul. 20, 2015  (KR) .................. 10-2015-0102524

(51) Int. Cl.
H02J 7/02      (2016.01)
H05K 9/00      (2006.01)
H02J 50/23     (2016.01)
H05K 7/20      (2006.01)

(52) U.S. Cl.
CPC ............... H02J 7/02 (2013.01); H02J 50/23 (2016.02); H05K 7/20 (2013.01); H05K 9/0075 (2013.01); H05K 9/0084 (2013.01); H05K 9/0088 (2013.01)

(58) Field of Classification Search
None
See application file for complete search history.

(56) References Cited

U.S. PATENT DOCUMENTS

2006/0290460 A1* 12/2006 Waffenschmidt ...... H05K 1/165
                                                        336/223
2012/0024587 A1   2/2012 Kiyota et al.
(Continued)

FOREIGN PATENT DOCUMENTS

CN   102301844 A   12/2011
JP   2007-295557 A 11/2007
JP   2008-294385 A 12/2008
(Continued)

OTHER PUBLICATIONS

International Search Report of the ISA/KR dated Nov. 1, 2016; for PCT/KR2016/007680; 4 pages.
(Continued)

Primary Examiner — Jared Fureman
Assistant Examiner — Aqeel H Bukhari
(74) Attorney, Agent, or Firm — Daly Crowley Mofford & Durkee, LLP (57) ABSTRACT Disclosed is a magnetic field shielding unit. The magnetic field shielding sheet includes a magnetic field shielding sheet and a metallic protecting member attached to a surface of the magnetic field shielding sheet via an adhesive layer for protecting the magnetic field shielding sheet as well as to for radiating heat generated from a heat source.

10 Claims, 9 Drawing Sheets

(56) References Cited

U.S. PATENT DOCUMENTS

2015/0123604 A1\* 5/2015 Lee .................. H01F 38/14
320/108
2016/0064814 A1 3/2016 Jang et al.

FOREIGN PATENT DOCUMENTS

| JP | 2009-200174 A | 9/2009 |
|---|---|---|
| JP | 2009-290075 | 12/2009 |
| JP | 2013-201296 A | 10/2013 |
| JP | 2014-107539 A | 6/2014 |
| JP | 2014-132658 A | 7/2014 |
| JP | 2015-505166 A | 2/2015 |
| KR | 10-2011-0111425 | 10/2011 |
| KR | 10-2013-0050633 | 5/2013 |
| KR | 10-1272397 | 6/2013 |
| KR | 10-2014-0109336 | 9/2014 |
| WO | WO 2014/137151 A1 | 9/2014 |

OTHER PUBLICATIONS

Japanese Notice of Reasons for Refusal (with Machine English Translation) dated Feb. 14, 2020 for Japanese Application No. 2018-502653; 29 Pages.

\* cited by examiner

MAGNETIC FIELD SHIELDING UNIT

CROSS-REFERENCE TO RELATED APPLICATION

This application is a U.S. National Stage of PCT/KR2016/007680 filed in the Korean language on Jul. 14, 2016, entitled: "Magnetic Field Shielding Unit" which application claims priority to Korean Application No. 10-2015-0102524 filed on Jul. 20, 2015, which applications are each hereby incorporated herein by reference in their entireties.

BACKGROUND

1. Technical Field

The present disclosure relates to a magnetic field shielding, and more particularly, to a magnetic field shielding unit that shields a magnetic field to prevent external leakage and condense the magnetic field in a desired direction.

2. Discussion of the Related Art

Recently, a portable terminal has a wireless charging function for wirelessly charging a built-in battery. The wireless charging can be performed by a wireless power receiving module built in the portable terminal, and a wireless power transmitting module for wirelessly supplying power to the wireless power receiving module.

In this case, the wireless power transmitting module and the wireless power receiving module include a wireless power transmitting antenna for transmitting or receiving wireless signal, and a shielding sheet to shield a magnetic field generated from the wireless power transmitting antenna to prevent external leakage and condense the magnetic field in desired direction.

As for the shielding sheet, a magnetic member is generally used. For example, a fluorine resin protective film such as a polyethylene terephthalate (PET) may be attached to the magnetic member to prevent the shielding sheet from being exposed.

However, the conventional protective film cannot satisfactorily perform a function as a protective film because strength of the raw material for the protective film is so weak that it may be torn or scratched easily by an external impact.

In recent years, an electronic device such as the portable terminal become thinner and smaller, and accordingly, components to be incorporated in the electronic device are also required to be thinner and smaller. For example, the wireless power receiving module to be incorporated in the portable terminal usually has been made to have a very thin overall thickness, about 0.3 mm, which will become thinner in the future.

Accordingly, research and development are carried out in various aspects in order to satisfy the characteristics required for such a very thin thickness. For this, there is a need for a solution to improve the characteristics while maintaining the same as or thinner thickness than that of a conventional product by making the components constituting the wireless power receiving module to be multifunctional, that is, by changing a material or a shape of a component having only one function, so as to make the component to have an additional function, in addition to its original function, for assisting its neighboring component in cooperation with other components.

SUMMARY

To solve the above problem and defects, it is an object of the present disclosure to provide a magnetic field shielding unit of which protective film to be attached to an exposed surface of a shielding sheet is replaced with a metallic material so that the shielding sheet can have an increased rigidity due to the metallic protective film itself and thus effectively prevent a damage by an external impact, thereby enhancing a protecting function against an external environment.

In addition, it is another object of present disclosure to provide the magnetic field shielding unit which can enhance a heat radiating performance of the wireless power transmitting module by adding a heat radiating function and a protective function by replacing a protective film of the shielding sheet to attached to a surface of the shielding sheet with a metallic thin film having thermal conductivity.

To accomplish the above and other objects of the present disclosure, there is provided that a magnetic field shielding unit which includes a magnetic field shielding sheet; and a metallic protecting member attached to a surface of the magnetic field shielding sheet via an adhesive layer for protecting the magnetic field shielding sheet in addition to for radiating heat generated from a heat source.

In an embodiment of the present disclosure, the metallic protecting member may be made of a metallic thin film having a thermal conductivity of 200 W/m·K or more. Preferably, the metallic thin film may be made of aluminum or copper foil.

In an embodiment of the present disclosure, a thickness of the metallic protecting member may be $1/9$ to $1/3$ of a thickness of the magnetic field shielding sheet.

In an embodiment of the present disclosure, the metallic protecting member may include at least one slit having a predetermined length.

In an embodiment of the present disclosure, the slit may be formed on an area corresponding to a wireless power transmitting antenna for transmitting wireless power.

In an embodiment of the present disclosure, the slit may be formed in a direction perpendicular to a longitudinal direction of a pattern constituting the wireless power transmitting antenna, or in a direction perpendicular to a tangent of a pattern constituting the wireless power transmitting antenna.

In an embodiment of the present disclosure, the adhesive layer may include a thermal conductive component.

According to a preferred another embodiment of the present disclosure, the metallic protecting member may include a substrate layer made of a metallic material and a coating layer which is coated for radiation on at least one side of the substrate layer. In an embodiment of the present disclosure, the coating layer may include at least one selected from ceramics and metallic oxides.

In an embodiment of the present disclosure, the magnetic field shielding sheet may include any one of a ribbon sheet including at least one of an amorphous alloy and a nanocrystal alloy, a ferrite sheet, and a polymer sheet. The ferrite sheet may be a Mn—Zn ferrite sheet or a Ni—Zn ferrite sheet.

In an embodiment of the present disclosure, the magnetic field shielding sheet may be multi-layered ribbon sheets including at least one of an amorphous alloy and a nanocrystalline alloy.

In an embodiment of the present disclosure, the magnetic field shielding sheet may include a plurality of fine pieces which are divided, and the plurality of fine pieces may be entirely or partially insulated between neighboring fine pieces. The plurality of fine pieces may have irregular shapes.

In an embodiment of the present disclosure, the magnetic field shielding sheet may include a plurality of sheets having different characteristics in a predetermined frequency band.

According to the preferred embodiments of the present disclosure, the protective film to be attached to the magnetic field shielding sheet made from a metallic material that can enhance rigidity of the heat radiating member. As a result, the protective film can prevent the magnetic field shielding sheet from being damaged by an external impact, thereby enhancing the protection function for the magnetic field shielding sheet against the external environment.

In addition, according to the embodiments of the present disclosure, the magnetic field shielding sheet can have an enhanced heat radiating performance and reduced overall thickness by replacing the protective film attached to one surface of the magnetic field shielding sheet with a metallic protecting member made from a metallic material having thermal conductivity, so as to add the heat radiating function in addition to the protecting function.

According to the embodiments of the present disclosure, the metallic protection member is formed with the slit-like structure for suppressing eddy current loss as well as the coating layer for improving the radiation performance. Thus, the heat radiating efficiency can be improved and the wireless charging efficiency can be further increased.

DETAILED DESCRIPTION OF THE EMBODIMENTS

Hereinafter, exemplary embodiments of the present disclosure will be described in detail with reference to the accompanying drawings, which will be readily apparent to those skilled in the art to which the present disclosure pertains. The present disclosure may be embodied in many different forms and is not limited to the embodiments described herein. In the drawings, parts not relating to the description are omitted for clarifying the present disclosure, and the same reference numerals are assigned to the same or similar components throughout the specification.

Figure 1:
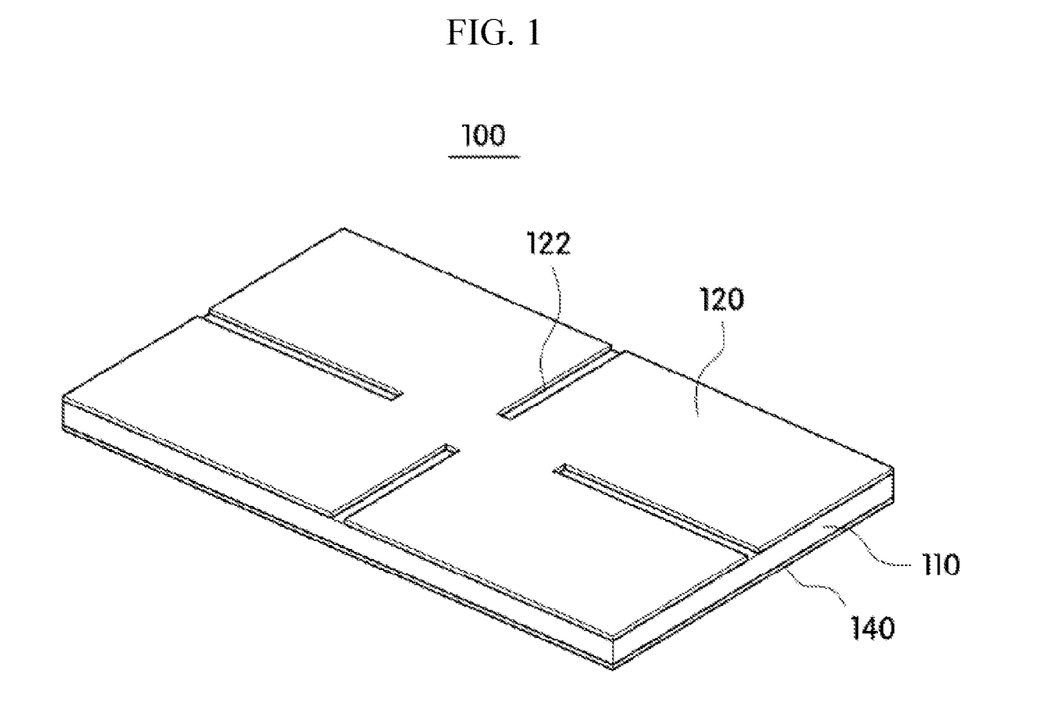
FIG. 1 is a perspective view showing a magnetic field shielding unit, according to an exemplary embodiment of the present disclosure.
Figure 2:
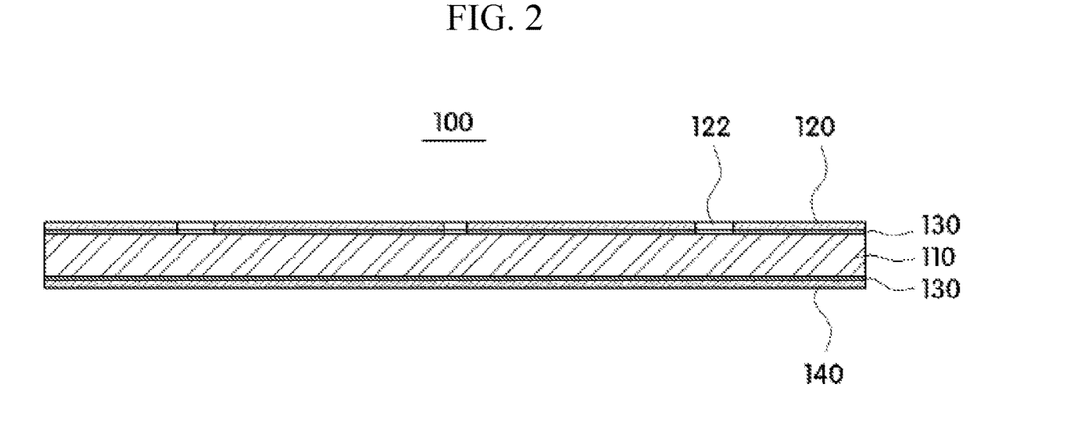
FIG. 2 is a sectional view of the magnetic field shielding unit in FIG. 1.

In an exemplary embodiment, a magnetic field shielding unit 100 may include a magnetic shielding sheet 110 and a metallic protecting member 120 as shown in FIGS. 1 and 2.

The magnetic field shielding sheet 110 may enhance a performance of an antenna using a predetermined frequency band by shielding the magnetic field generated from the antenna to increase a condensing performance of the magnetic field.

In an exemplary embodiment, the magnetic field shielding sheet 110 may be disposed on a side of the antenna unit 10 that performs a predetermined function by transmitting or receiving a wireless signal using a predetermined frequency band.

To this end, the magnetic field shielding sheet 110 is made from a magnetic material so as to shield the magnetic field generated from the antenna unit 10.

In an exemplary embodiment, the magnetic field shielding sheet 110 may include any one of a ribbon sheet including at least one of an amorphous alloy and a nanocrystal alloy, a ferrite sheet, and a polymer sheet.

Here, the ferrite sheet may be a sintered ferrite sheet, and may include Ni—Zn ferrite or Mn—Zn ferrite. In addition, the ribbon sheet may include an Fe-based or a Co-based magnetic alloy, and the amorphous alloy or the nanocrystal alloy may include a Fe-based or Co-based magnetic alloy.

Figure 6:
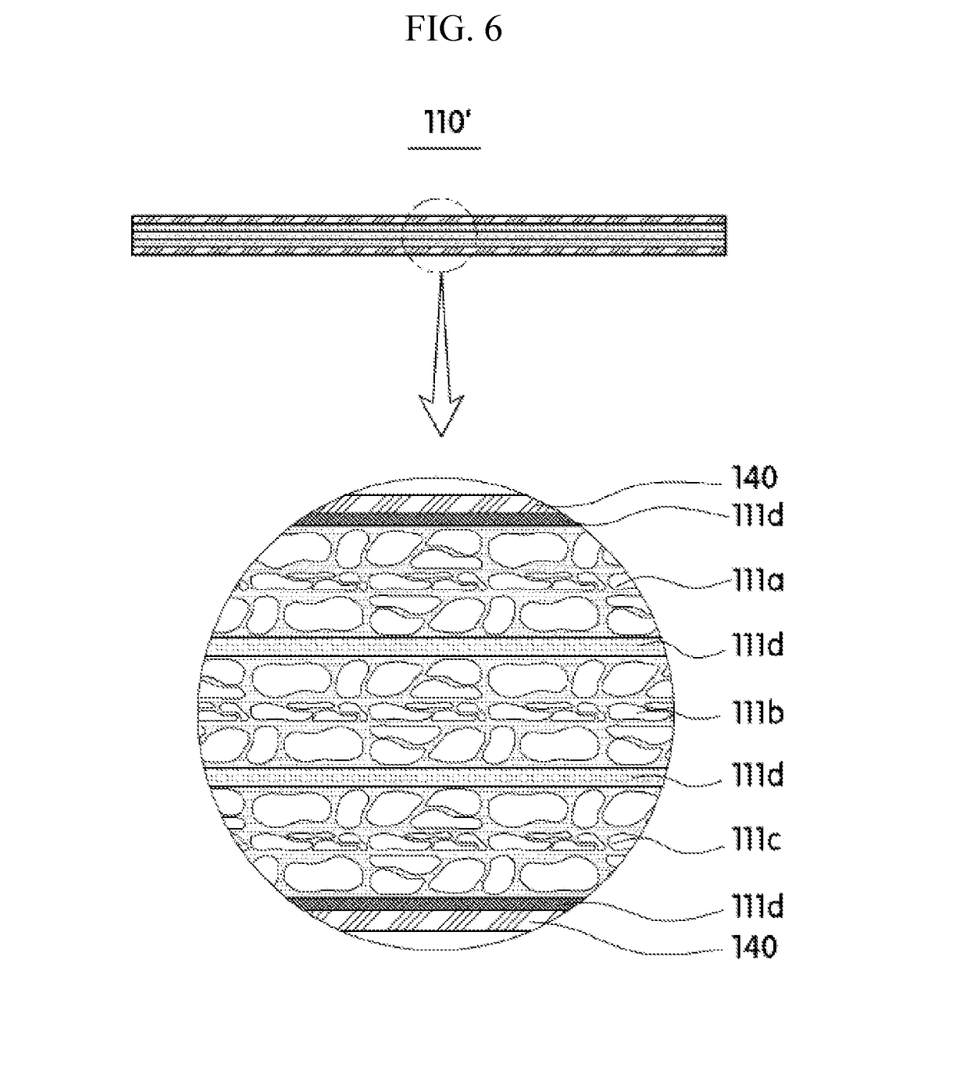
FIG. 6 is a schematic view of a shielding sheet applied to a magnetic field shielding unit, according to an exemplary embodiment of the present disclosure.

As shown in FIG. 6, the magnetic field shielding sheet 110' may be provided by stacking a plurality of magnetic sheets 111a, 111b and 111c. The magnetic field shielding sheet 110 may include a plurality of divided fine pieces so as to suppress generation of eddy currents by increasing the overall resistance, and the plurality of divided fine pieces may be totally or partially insulated from each other. The plurality of pieces may have a size of 1 μm to 3 mm, and each respective pieces may have irregular shapes.

When the magnetic field shielding sheet 110 is constructed by stacking the plurality of shielding sheets 111a, 112b, and 111c divided into fine pieces to form multi-layers, an adhesive member 111d including a nonconductive component may be disposed between adjacent sheets. Thereby, a part or the whole of the adhesive member 111d between adjacent sheets stacked on each other may permeate between the plurality of fine pieces constituting each sheet, and totally or partially insulate the neighboring fine pieces from each other. Here, the adhesive member 111d may be an inorganic-material-type adhesive agent in liquid or gel form, or may be a substrate-type in which an adhesive agent is applied to a side or both sides of a film type substrate.

For example, the magnetic field shielding sheet may be a multilayered ribbon sheet which may be formed by stacking a plurality of ribbon sheets 111a, 111b, and 111c including at least one of an amorphous alloy and a nano-crystal alloy. Each ribbon sheet 111a, 111b, or 111c may be formed of divided fine pieces having irregular shapes. The adhesive member 111d disposed between the ribbon sheets stacked on each other may permeate between the plurality of fine pieces, and totally or partially insulates the neighboring fine pieces from each other.

The antenna unit 10 may include at least one antenna for transmitting or receiving a wireless signal using a predetermined frequency band, and may be composed of a plurality of antennas 12, 13, and 14 that perform different roles using different frequency bands.

Figure 3A:
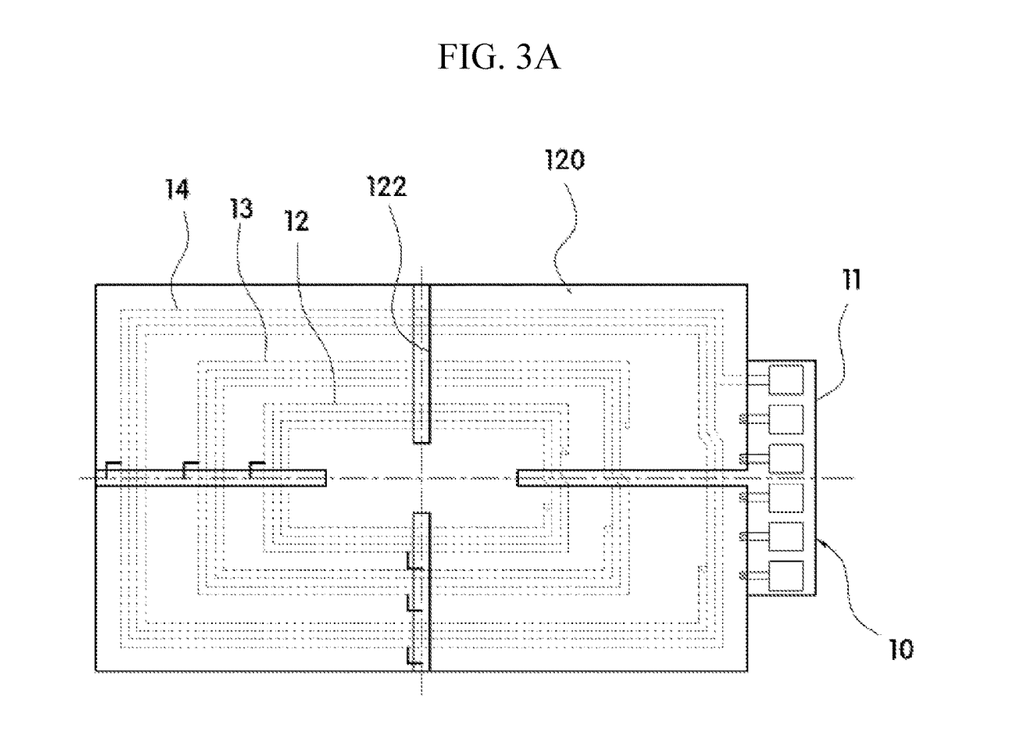
FIGS. 3A and 3B are schematic views showing a disposition relationship between a slit and a wireless power transmitting antenna, respectively, when the slit is formed in a metallic protective member applied to the magnetic field shielding unit, according to exemplary embodiments of the present disclosure.
Figure 3B:
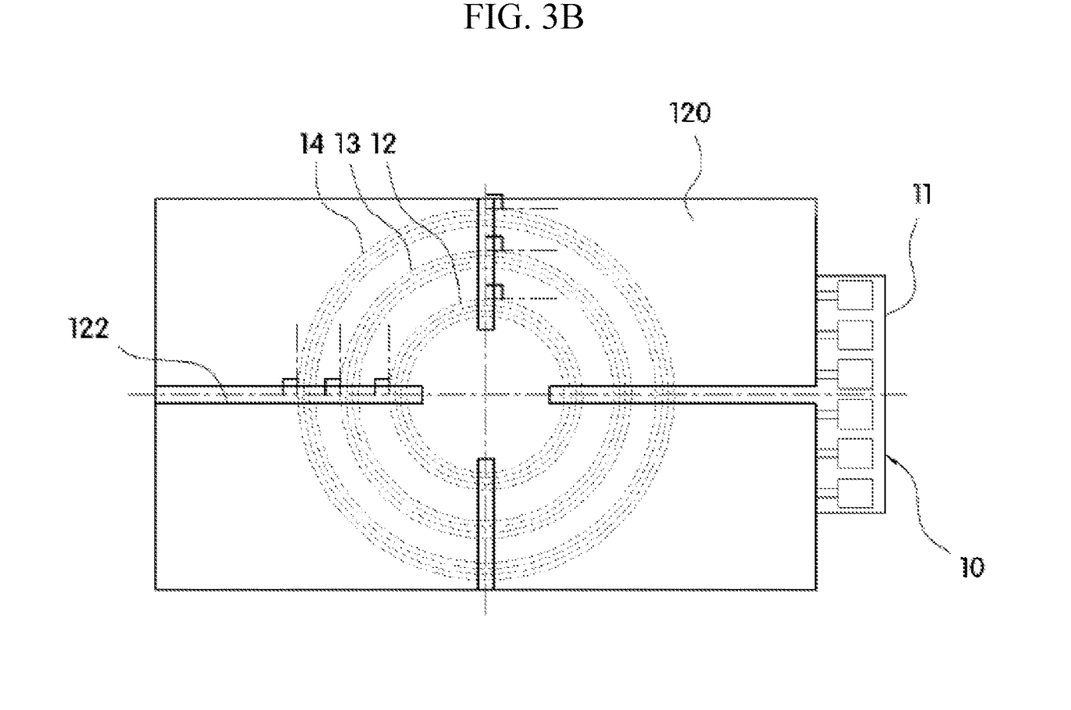
Figure 4A:
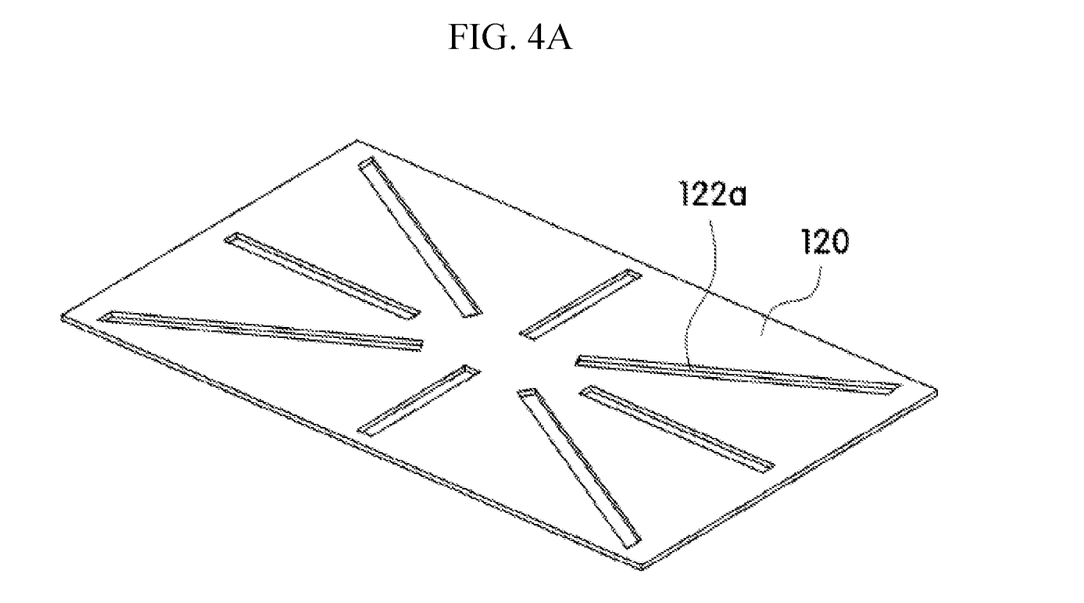
FIGS. 4A to 4D are views showing various forms of slits in the metallic protecting member, according to exemplary embodiments of the present disclosure.
Figure 4B:
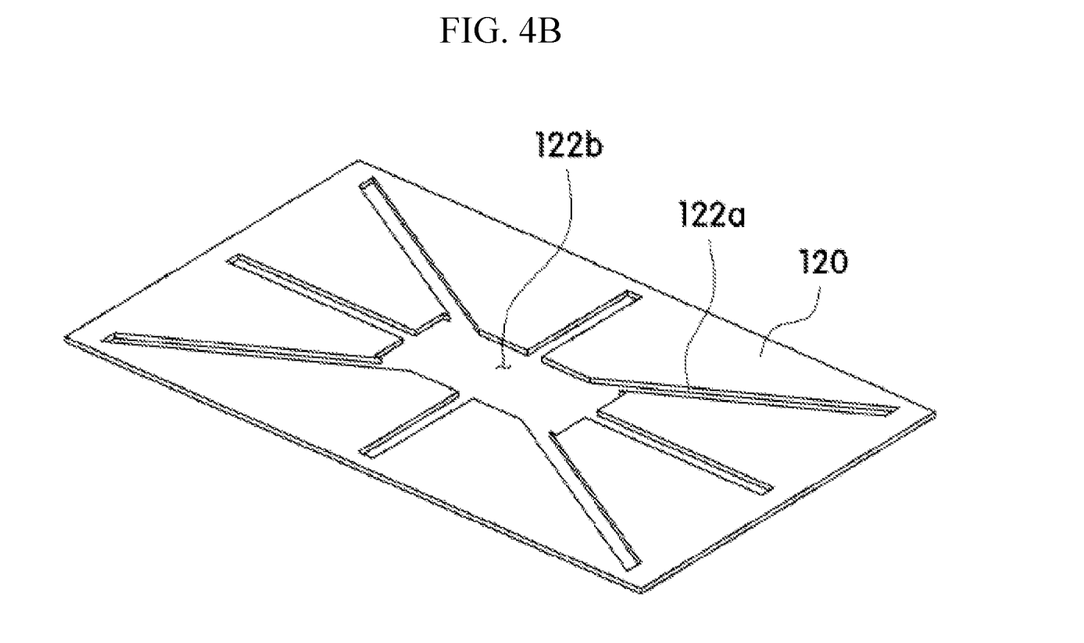
Figure 4C:
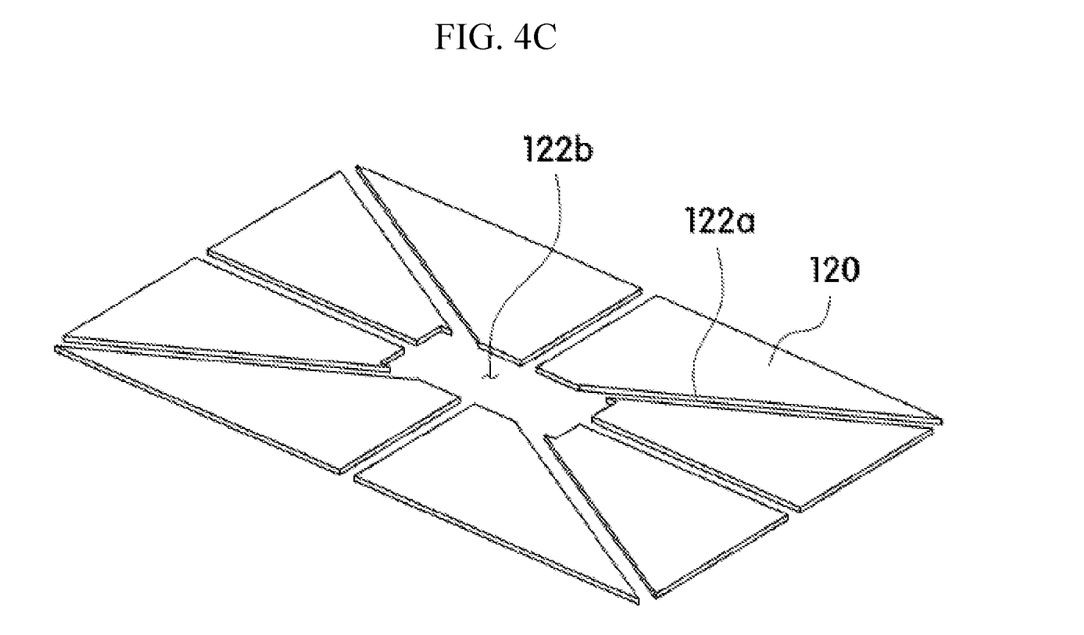
Figure 4D:
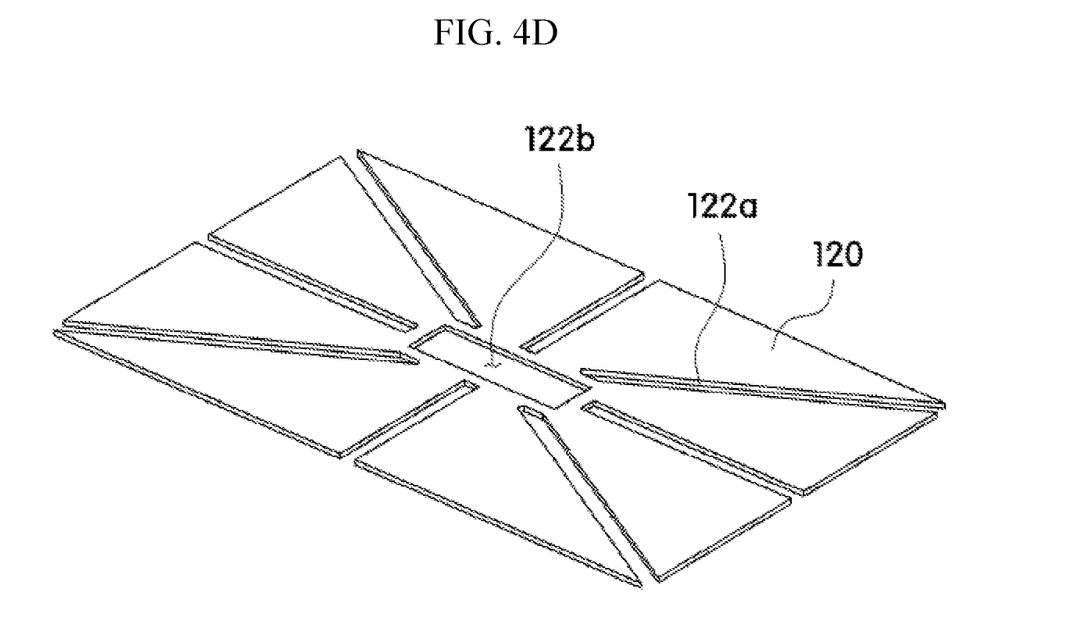
Figure 7A:
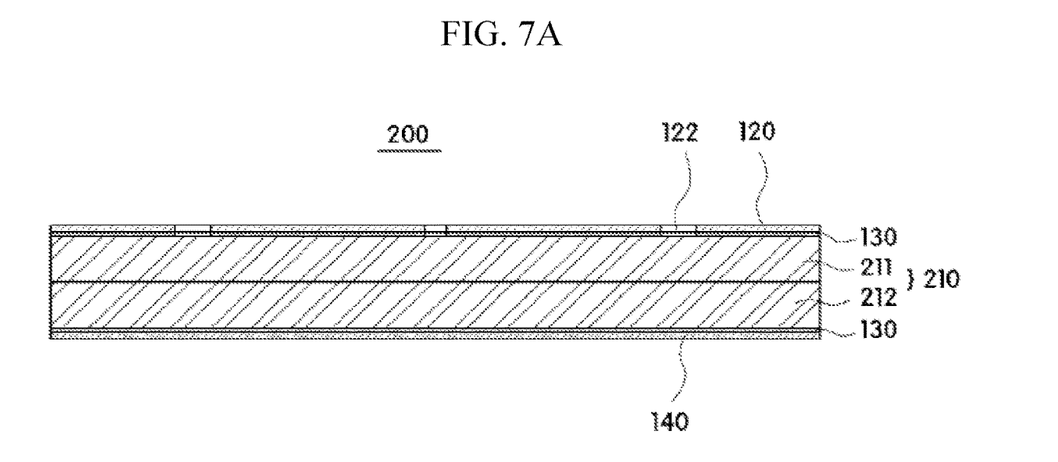
FIG. 7A to 7C are views showing various disposition relationship between a first shielding sheet and a second shielding sheet in case that the shielding sheet includes the first shielding sheet and the second shielding sheet, according to exemplary embodiments of the present disclosure.
Figure 7B:
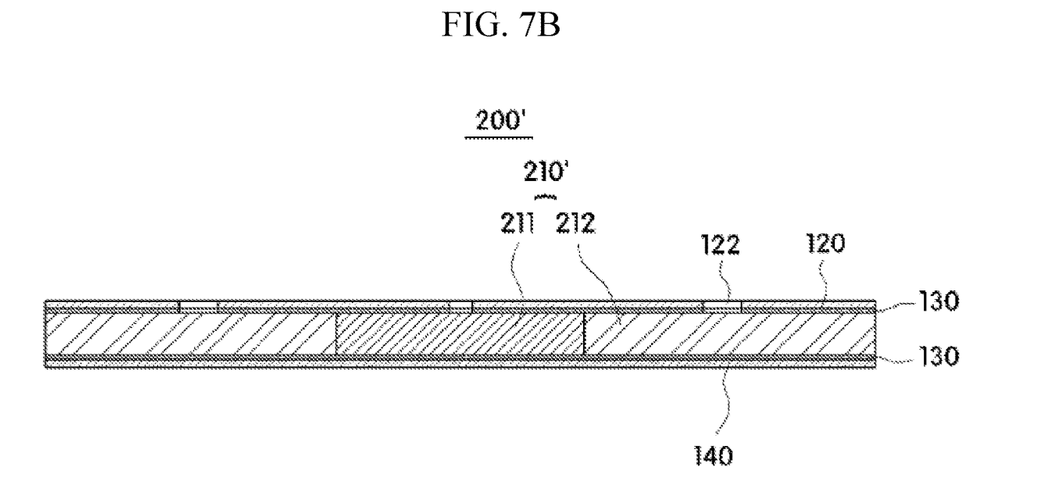
Figure 7C:
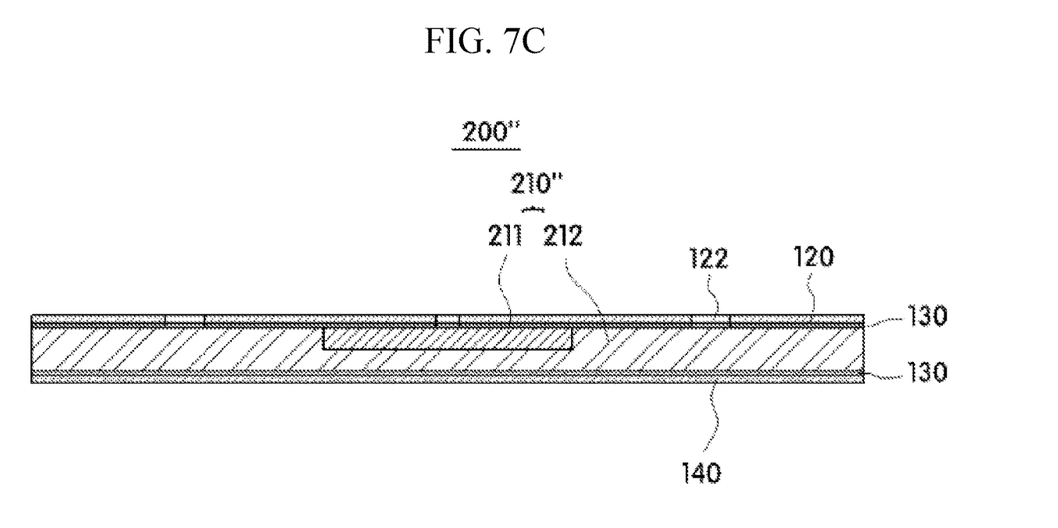

For example, the plurality of antennas 12, 13, and 14 may include at least one of a wireless power transmitting antenna 12, a magnetic secure transmission (MST) 13 antenna and a near field communication (NFC) antenna 14 (refer to FIGS. 3A, 3B and 7).

Here, a plurality of the antennas 12, 13 and 14 may be formed of a flat coil wound in a clockwise direction or counterclockwise direction. The wound flat coil may have a circular shape, an elliptical shape, a spiral shape, or a polygonal shape such as a quadrangular shape. The antenna may be a loop-shaped coil pattern which can be made by patterning a conductor such as a copper foil on at least one surface of a circuit board 11 made from synthetic resin such as polyimide (PI), polyethylene terephthalate (PET), or the like, or by using conductive ink, or may be configured in a form of combination of the flat coil and the metallic pattern formed on a side of the circuit board 11.

The metallic protecting member 120 may be attached to a surface of the magnetic field shielding sheet 110 via the adhesive member 130. Preferably, the metallic protecting member 120 may be disposed on a surface of the antenna unit 10 which is the opposite the magnetic field shielding sheet 110, that is, on the surface of the magnetic field shielding sheet 110 exposed to the outside.

Here, the metallic protecting member 120 may concurrently perform a function of protecting the magnetic field shielding sheet 110 and a function of radiating heat generated from the heat source to the outside.

In other words, the metallic protecting member 120 applied to the present disclosure may concurrently perform the function as the protective sheet and the function as the heat radiating sheet.

For this purpose, the metallic protecting member 120 may be made of a metallic material having thermal conductivity. Accordingly, the metallic protecting member 120 may radiate heat transferred from the heat source to the outside, thereby securing the heat radiating performance through the metallic protecting member 120 without using the separate heat radiating member such as graphite.

Here, the metallic protection member 120 may be formed to have a thin thickness so as not to increase the overall thickness of the magnetic field shielding unit 100, and may be formed to have a relatively thin thickness as compared with the magnetic field shielding sheet 110. Preferably, a thickness of the metallic protection member 120 may be ⅕ to ⅓ of the thickness of the magnetic field shielding sheet 110.

That is, the metallic protecting member 120 may have substantially same thickness as that of a conventional protective film attached to at least one surface of the magnetic field shielding sheet 110 to protect the magnetic field shielding sheet 110. The metallic protective member 120 attached to a surface of the magnetic field shielding sheet 110 may replace the conventional protective film used for simply protecting the magnetic field shielding sheet 110.

Accordingly, unlike the conventional protective film protecting the magnetic field shielding sheet 110 from the surrounding environment, the metallic protecting member 120 can perform concurrently the function for protecting the magnetic field shielding sheet 110 and the function for radiating heat.

Here, the metallic material constituting the metallic protecting member 120 may be cooper, aluminum or an alloy based on combination thereof, which have excellent thermal conductivity, or may be an alloy including at least one of copper or aluminum. The metallic protecting member 120 may have a thickness which is ⅕ to ⅓ of a thickness of the magnetic field shielding sheet 110.

For example, the metallic protection member 120 may be a metallic thin film having the thermal conductivity of 200 W/m·K or more, and the metallic thin film may have the thickness of ⅕ to ⅓ of the thickness of the magnetic field shielding sheet 110. For example, the metallic protecting member 120 may be a plate-shaped aluminum foil or a copper foil having a predetermined area.

The magnetic field shielding unit 100 according to the present disclosure may be constructed such that the metallic protecting member 120 is made from the metallic material having very thin thickness and is directly attached to a surface of the magnetic field shielding sheet 110 via the adhesive member 130. Accordingly, the magnetic field shielding unit 100 can further have the heat radiating function in addition to the protecting function while having the same thickness as or less than that of the conventional protective film that merely performs the protective function.

As a result, the protecting function and the heat radiating function may be performed concurrently through the metallic protecting member 120 without increasing the overall thickness of the magnetic shielding unit 100 according to exemplary embodiments of the present disclosure. Therefore, even if the magnetic shielding unit 100 according to present disclosure 100 is used alone, the magnetic shielding unit 100 can perform not only the shielding function for shielding the magnetic field but also the heat radiating function for radiating heat.

In addition, since the metallic protecting member 120 is made from the metallic material, the rigidity of the material itself is increased, so that the rigidity of the protective film 120 can be significantly increased as compared with the conventional protective film made from material such as PET. Since the magnetic field shielding unit 100 according to the present disclosure has the metallic protective member 120 replacing the conventional protective film which is easily damaged by an external impact or scratche, the magnetic field shielding sheet 110 can be stably protected from an external impact. Accordingly, the magnetic field shielding sheet 110 can be protected by the metallic protecting member 120, and the deformation such as cracks due to the external impact is prevented, thereby minimizing the change in characteristics.

Figure 8:
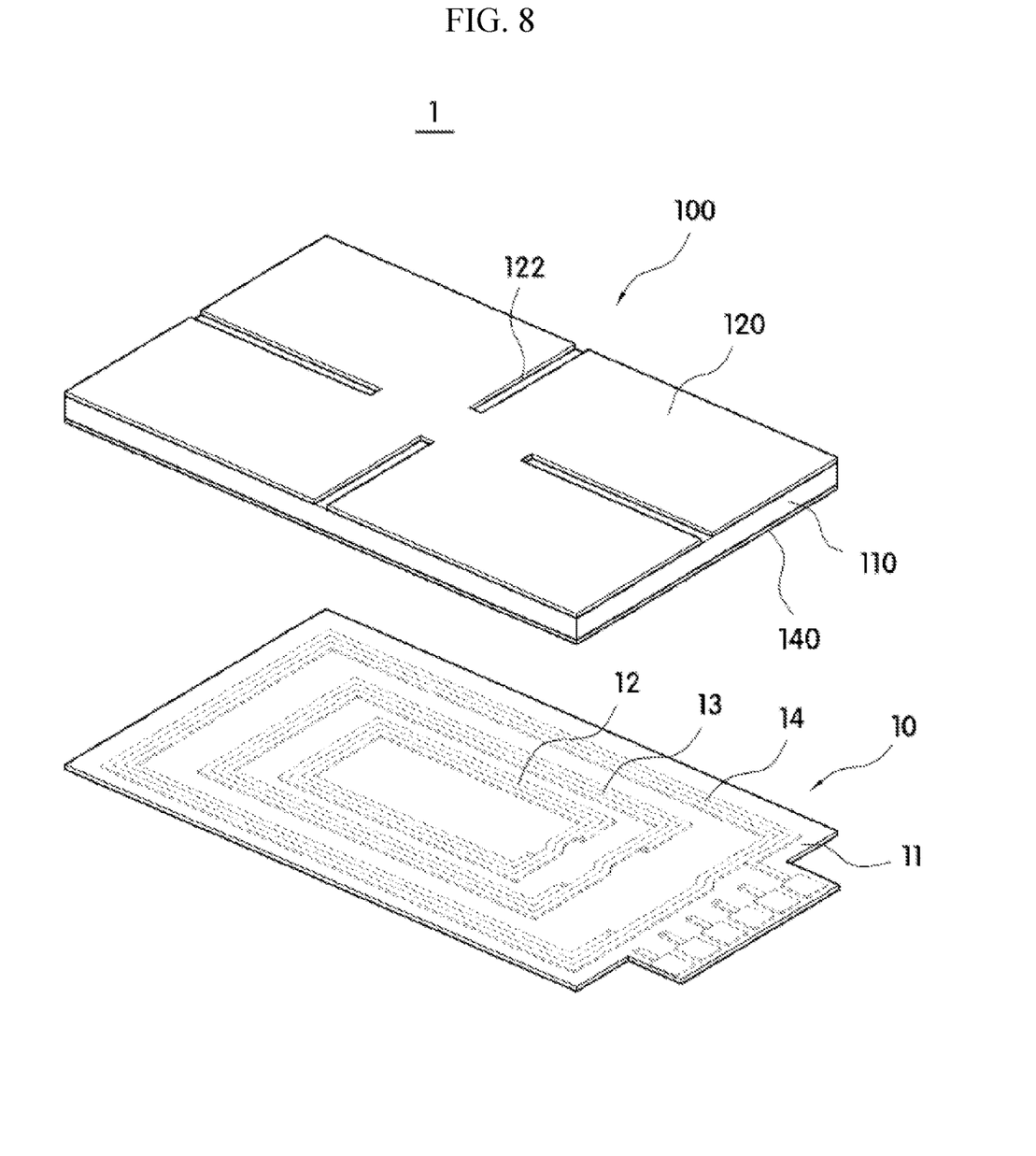
FIG. 8 is a schematic view of a wireless power transmitting module to which the magnetic field shielding unit is applied, according to an exemplary embodiment of the present disclosure.
Figure 9:
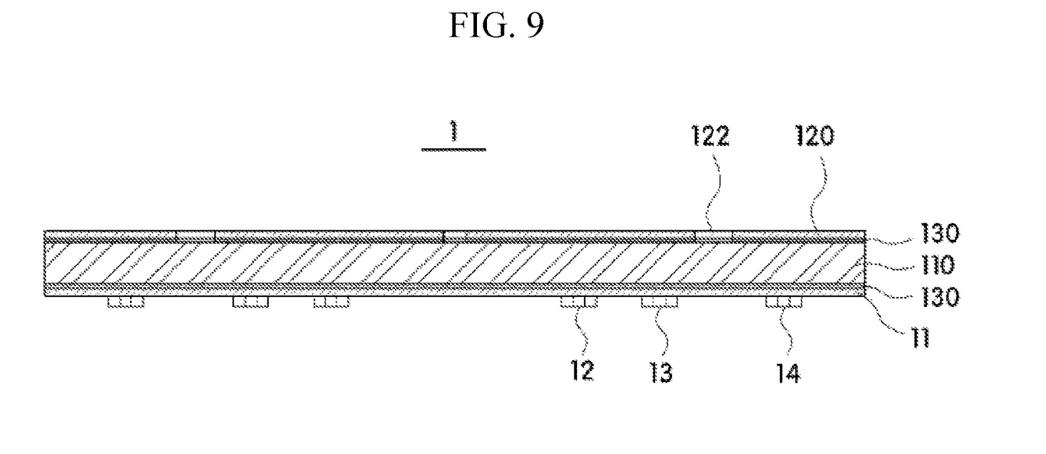
FIG. 9 is a sectional view of the wireless power transmitting module shown in FIG. 8.

For example, the magnetic field shielding unit 100 according to the present disclosure may be applied to the wireless power transmitting module 1 including an antenna unit 10 and the shielding sheet 110 as shown in FIGS. 8 to 9. Particularly, when the wireless power transmitting module 1 is implemented based on a wireless power receiving module under a design condition with severe limitations with respect to total thickness, the heat generated from the heat source including the antenna unit 10 can be radiated to the outside through the metallic protecting member 120. Thus, the entire thickness of the wireless power receiving module may be further reduced since there is no need to use a separate heat radiating member for radiating heat.

Here, in order to protect the magnetic field shielding sheet 110, the protective film 140 formed of a fluorine resin film including at least one of a polyethylene terephthalate (PET), polypropylene (PP), and polyterephthalate (PTFE) may be attached through the adhesive member 130 on the other surface of the magnetic field shielding sheet 110 on which the metallic protecting member 120 is not attached.

Accordingly, in case that the antenna unit 10 is attached to the surface of the magnetic field shielding unit 100 according to the present disclosure, by removing the protective film 140, the antenna unit 10 may be directly attached to a surface of the magnetic field shielding sheet 110 through the adhesive member 130 which is disposed between the protective film 140 and the magnetic field shielding sheet 110.

On the other hand, the adhesive member 130 may include the thermal conductive component to further enhance the heat radiating effect. The adhesive member 130 may be an inorganic-material-type adhesive agent in liquid or gel state including the thermal conductive component. In addition, the adhesive member 130 may be a plate-shaped substrate or the substrate-type on which at least one surface of the substrate is coated with liquid or gel type adhesive agent including the thermal conductive component.

In an exemplary embodiment of the present embodiment, the adhesive agent may include a thermosetting, a photo-curing-type, or a decompressive-adhesion-type adhesive component, depending on a selected adhesive method. The adhesive component may be any one selected from a group of acrylic, urethane, epoxy and silicone adhesive agent, and may further include a hardening agent which is commonly used for crosslinking the adhesive component. Since the hardening agent may be selected in consideration of the specific kind of the selected adhesive component and the adhesive method, the present disclosure is not particularly limited thereto.

In addition, the adhesive agent may further include the thermal conductive component for the heat radiating property, and the kind thereof is not limited as long as it has thermal conductivity. As a non-limiting example, the thermal conductive component may be metallic, inorganic, organic, or mixture material thereof.

Specifically, the thermal conductive component may include at least one material selected from the group consisting of a metal powder such as aluminum (Al), nickel (Ni), copper (Cu), tin (Sn), zinc (Zn), tungsten (W), iron (Fe), silver (Ag), gold (Au), and the like; calcium carbonate (CaCO3), aluminum oxide (Al2O3), aluminum hydroxide (Al(OH)3), silicon carbide (SiC); an inorganic powder such as boron nitride (BN) and aluminum nitride (AlN); and as for carbon material, an organic powder such as graphite, graphene, carbon nanotubes (CNT), carbon nanofibers (CNF) and the like. The thermal conductive component may preferably include at least one carbon material selected from the group consisting of graphite, graphene, CNT, and CNF.

In an exemplary embodiment of the present embodiment, the adhesive agent may be formed through an adhesive component, a hardening agent, a carbon-based filler as the thermal conductive component, and a heat-radiation-adhesive-layer forming component including a physical property enhancing component for enhancing the heat radiation property and the adhesion property. The carbon-based filler may be mixed in an amount of 0.1 to 60% by weight in the heat-radiation-adhesive-layer forming component. 0.01 to 20 parts by weight of the physical property enhancing component may be mixed with 100 parts by weight of the carbon-based filler. The remaining amount may be the adhesive component and the hardening agent.

Here, 5 to 300 parts by weight of the hardening agent may be mixed with 100 parts by weight of the adhesive agent, but the mixture ratio may not be limited thereto, and the mixture ratio may be changed according to the purpose.

The adhesive component may preferably be epoxy resin. As a non-limiting example, it may be at least one material selected from the group consisting of glycidyl ether type epoxy resin, glycidylamine type epoxy resin, glycidyl ester type epoxy resin, linear aliphatic type epoxy resin, cyclo aliphatic epoxy resin, heterocyclic containing epoxy resin, substituted epoxy resin, naphthalene-based epoxy resin, and derivatives thereof.

When the epoxy resin is contained as the adhesive component, the hardening agent may include at least one of a polyhydric hydroxy compound, an aliphatic amine, an aromatic amine, an acid anhydride, and a latent hardening agent. The carbon-based filler may include one selected from the group consisting of single-walled carbon nanotube, double-walled carbon nanotube, multi-walled carbon nanotube, graphene, graphene oxide, graphene nanoplate, graphite, carbon black, carbon-metal complex, and the like.

The physical property enhancing component may preferably include a silane compound, and the silane-based compound may be 3-[N-anil-N-(2-aminoethyl)] aminopropyltrimethoxysilane, 3-(N-anil-N-glycidyl) aminopropyltrimethoxysilane, 3-(N-anil-N-methacrylonyl) aminopropyltrimethoxysilane, 3-glycidyloxypropylmethylethoxysilane,N,N-Bis [3-(trimethoxycinyl)propyl]methacrylamide, γ-glycidoxytrimethyldimethoxysilane, 3-glycidyloxypropyltrimethoxysilane, 3-glycidyloxy propyltriethoxysilane, 3-glycidyloxypropylmethylmethoxysilane, beta (3,4-epoxycyclohexyl) ethyltrimethoxysil, 3-methacryloxypropyltrimethoxysilane, 3-glycidyloxypropylmethyldimethoxysilane, heptadecafluorodecyltrimethoxysilane, 3-methacryloxypropylmethyldimethoxysilane, 3-methacryloxypropyl Tris (trimethylsiloxy) silane, methyltris (dimethylsiloxy) silane, 3-aminopropyltriepoxysilane, 3-mercaptopropyltrimethoxysilane and N-(β-aminoethyl)-γ-aminopropyltrimethoxysilane, and the like.

Here, one or more kinds of additives such as a dispersant, a dispersion stabilizer, a leveling agent, a pH adjuster, an ion trapping agent, a viscosity adjuster, a thixotropic agent, an antioxidant, a heat stabilizer, a light stabilizer, an ultraviolet absorber, a coloring agent, a dehydrating agent, a flame retardant, an antistatic agent, an antifungal agent, an antiseptic agent and the like may be added to the heat-radiation-adhesive-layer forming composition. The various additives listed above can be those well known in the art and are not particularly limited in the present disclosure. Further, the heat-radiation-adhesive-layer forming component may further include a solvent, and a conventional solvent may be selected according to the selected adhesive component, so that the present disclosure is not particularly limited thereto.

Figure 5:
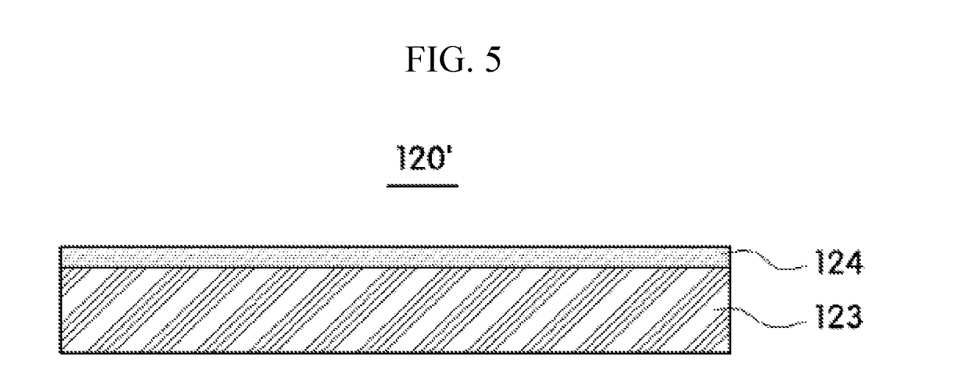
FIG. 5 is a view showing a sectional view of the metallic protecting member laminated with a coating layer, according to an exemplary embodiment of the present disclosure.

As shown in FIG. 5, the metallic protective member 120' may include a substrate layer 123 made from the metallic material for heat radiation and a coating layer 124 coated for radiation on at least one surface of the substrate layer 123. Here, the coating layer 124 may be formed of a metallic oxide material including ceramic or carbon black having a nano-sized particle.

The coating layer 124 may increase the radiation rate to further enhance the heat radiating effect of the metallic protecting member 120'.

In addition, the metallic protecting member 120 may form an oxide film by oxidizing the surface of the metallic material constituting the metallic protecting member 120 through the blackening treatment. For example, in case that the metallic material is copper, the oxide film may be a material such as CuO or Cu2O.

By this process, it is possible for the oxide film to minimize a cracking by preventing corrosion and to improve the adhesion according to the increasing of the surface area and increase radiation performance of the material itself, thereby enhancing the heat radiating property without increasing the overall thickness.

In addition, the oxide film formed on the surface of the metallic layer may act as an insulating layer, thereby increasing the overall resistance value, which can result in reducing the occurrence of eddy current. Here, the blackening treatment may be performed using chemicals, heat treatment, or plasma treatment.

According to an exemplary embodiment of the present disclosure, as shown in FIGS. 1 and 2, the metallic protecting member 120 may be formed with at least one slit 122 having a predetermined length to increase the self-resistance of the metallic protecting member 120, thereby suppressing the generation of eddy current.

Particularly, if the heat radiating sheet 100 is applied to a wireless power transmitting module 1 including at least one wireless power transmitting antenna 211, it is possible to increase the wireless charging efficiency by suppressing generation of the eddy current by means of the slit 122 formed in the metallic protecting member 120.

Here, the slit 122 may be provided overall or partially in the whole area of metallic protecting member 120. When a plurality of slits 122 are provided in the metallic protecting member 120, the plurality of slits 122 are disposed in a predetermined pattern, or in a random pattern.

In other words, the slit 122 may be formed in various forms because it can suppress the generation of eddy current even if at least one of the slits 122 is formed at an arbitrary position of the metallic protecting member 120. The slit 122 may be concentrically formed in a local area of the whole area of the metallic protecting member 120.

For example, the slit 122 may be formed in various forms as shown in FIGS. 4A to 4D. Specifically, each of the slits 122 may be formed in a form of an incision portion 122a with a predetermined length which radically extends to near the edge from the central part of the metallic protecting member 120 and passes through the metallic protecting member 120 (refer to FIGS. 4A and 4B). Each of the slits 122 may be formed in a form of an incision portion 122a which radically extends out to the edge from the central part of the metallic protecting member 120 and passes through the metallic protecting member 120 (refer to FIGS. 4C and 4D). The slit may be in the form of a through-hole 122b with a predetermined length formed on the inner part of the metallic protecting member 120 (refer to FIGS. 4B to 4D). In addition, the incision portion 122a and the through-hole 122b may be provided in a combined form (refer to FIGS. 4B to 4D). The incision portion 122a and the through-hole 122b may be connected to each other, or may not be connected to each other. Although the slit 122 is illustrated as passing through the metallic protecting member 120 in FIGS. 4A to 4D, the present disclosure is not limited thereto. The slit 122 may be provided as a receiving portion inserted with predetermined depth in a surface of the metallic protecting member 120.

Here, the slit 122 may be formed so as to avoid a specific position. In an exemplary example, it may be formed by avoiding an area corresponding to a heat generating component such as an application processor (AP) which generates a lot of heat during operation. In other words, since the slit 122 is not formed directly above or below the heat generating component, a hindrance of the radiating of heat transmitted from the heat generating component can be obviated, in the result, it becomes possible to minimize or prevent deterioration of the heat radiating performance.

The slit 122 may be formed in an area corresponding to the wireless power transmitting antenna 12 when the antenna unit 10 disposed on one side of the magnetic field shielding unit 100 includes the wireless power transmitting antenna 12. The slit 122 may be formed in a direction perpendicular to the pattern constituting the wireless power transmitting antenna 12.

As shown FIG. 3A, in case that the wireless power transmitting antenna 12 is formed in a rectangular pattern, the slit 122 may be provided so as to have a predetermined length in a direction perpendicular to the longitudinal direction of the pattern constituting the wireless power transmitting antenna 12.

As shown in FIG. 3B, in case that the wireless power transmitting antenna 12 is formed in a circular pattern, the slit 122 is may be provided so as to have a predetermined length in direction perpendicular to a tangent line of the pattern constituting the wireless power transmitting antenna 12.

In addition, when the wireless power transmitting antenna 12 is provided in a form having both a straight line section and a curved line section, the slit formed in the straight line section may be provided to have a predetermined length in a direction perpendicular to the longitudinal direction of the pattern constituting the wireless power transmitting antenna 12, as shown in FIG. 3A. And, the slit formed in the curved line section may be provided to have a predetermined length in a direction perpendicular to the tangent line of the pattern constituting the wireless power transmitting antenna 12, as shown in FIG. 3B.

Meanwhile, when the antenna unit 10 includes a plurality of antennas 12, 13, and 14 having different roles, the magnetic field shield sheet according to present disclosure may be provided with a plurality of sheets 211 and 212 having different characteristics so as to enhance the performance of the corresponding antennas 12, 13, and 14 respectively.

For example, when the antenna unit 10 includes a wireless power transmitting antenna 12 and an NFC antenna 14 operating in different frequency bands, the magnetic field shielding sheets 210, 210', or 210" for these antennas may include a first shielding sheet 211 and a second shielding sheet 212 having different characteristics so as to improve the performance of the corresponding antenna in the frequency band. Here, the antenna unit 10 may further include a MST antenna 13.

More specifically, the first shielding sheet 211 may be disposed in an area corresponding to the wireless power transmitting antenna 12 to enhance the performance of the wireless power transmitting antenna 12. The second shielding sheet 212 may be disposed on an area corresponding to the NFC antenna 14 to enhance the performance of the NFC antenna 14.

Here, the first shielding sheet 211 may have an area which can fully cover the wireless power transmitting antenna 12, and the second shielding sheet 212 may have an area which can fully cover the NFC antenna 14. In addition, when the MST antenna 13 is disposed outside the wireless power transmitting antenna 12, the first shielding sheet 211 may include, or not include right above area of the MST antenna 13.

In this case, magnetic field shielding unit 210 may be provided in a form that the first shielding sheet 211 is stacked on a side of the second shielding sheet 212 (refer to FIG. 7A). Moreover, in order to reduce the overall thickness of the magnetic field shielding sheets 210' and 210", the first shielding sheet 211 having the same thickness as the second shielding sheet 212 may be inserted into the second shielding sheet 212 (See FIG. 7B). The first shielding sheet 211 having a thinner thickness than the second shielding sheet 212 may be inserted into one surface of the second shielding sheet 212 (refer to FIG. 7C).

In other words, the first shielding sheet 211 and the second shielding sheet 212 may have different permeabilities in a predetermined frequency band, or may have different saturation magnetic fields. If the first shielding sheet 211 and the second shielding sheet 212 have the same permeability, these two shielding sheets 211 and 212 may have different values of permeability loss rate.

More specifically, the first shielding sheet 211 may have a relatively higher permeability than that of the second shielding sheet 212 in a low frequency band of 350 kHz or less, and may have a relatively higher saturation magnetic field than that of the second shielding sheet 212 in the frequency band of 350 kHz or less. In a case that the first shielding sheet 211 and the second shielding sheet 212 have the same permeability in the frequency band of 350 kHz or less, the permeability loss rate of the first sheet 211 may be lower than that of the second shielding sheet 212.

In an exemplary example, a ribbon sheet including at least one of an amorphous alloy and a nanocrystalline alloy may be used as the first shielding sheet 211. A ferrite sheet may be used as the second sheet 212.

Accordingly, since the ribbon sheet including at least one of an amorphous alloy and a nanocrystalline alloy has a relatively higher magnetic permeability than that of the ferrite sheet in the low frequency band of 350 kHz or less, a time-varying magnetic field generated through the wireless power transmission in the frequency band of 100 to 300 kHz by a wireless power transmission module during wireless charging can be attracted by the first shielding sheet 211 having a relatively higher permeability. Thus, the wireless power transmitting antenna 12 disposed on the first shielding sheet 211 can receive the wireless power signal with high efficiency.

Meanwhile, when the magnetic field shielding sheet 210, 210', or 210" is used for the wireless power receiving module and the wireless power transmitting module is provided with a permanent magnet, the magnetic field shielding sheet 210, 210' or 210" may be required to shield a time-invariant magnetic field generated by the permanent magnet provided in wireless power transmitting module. However, since the time-invariant magnetic field has a greater influence on the shielding sheet 210, 210' or 210" than the time-varying magnetic field generated by the antenna unit 10, the time-invariant magnetic field may cause the shielding sheet to be magnetically saturated, thereby drastically lowering the performance of the shielding sheet, or the power transmission efficiency.

Therefore, when the wireless power transmitting module employs the permanent magnet it is necessary to prevent magnetic saturation by the permanent magnet of the wireless power transmitting module. Since the ribbon sheet including at least one of the amorphous alloy and the nanocrystal alloy has a relatively larger saturation magnetic field than the ferrite sheet in the frequency band of 100 to 300 kHz, the first shielding sheet 211 disposed in an area corresponding to the wireless power transmitting antenna 12 can prevent magnetization by the permanent magnet in the wireless charging frequency band of 100 to 300 kHz, and thus smooth wireless charging can be achieved.

In addition, when the permeability loss rate of the first shielding sheet 211 is lower than that of the second shielding sheet 212 even if the first shielding sheet 211 and the second shielding sheet 212 have the same permeability in the frequency band of 100 to 350 kHz, as a result the permeability loss according to the permeability loss rate is reduced during the wireless power charging.

Accordingly, the time-varying magnetic field generated through the power transmission in the frequency band of 100 to 350 kHz by the wireless power transmission module is induced toward the first shielding sheet 211 having a relatively higher permeability. Thus, the wireless power transmitting antenna 12 disposed in an area corresponding to the first shielding sheet 211 can receive the wireless power signal with high efficiency.

Meanwhile, the second shielding sheet 212 may have a relatively higher magnetic permeability at a high frequency of 13.56 MHz than that of the first shielding sheet 211. In a case that the first shielding sheet 211 and the second shielding sheet 212 have the same permeability at the frequency of 13.56 MHz, the permeability loss rate of the second shielding sheet 212 may be relatively smaller than the permeability loss rate of the first shielding sheet 211.

In an exemplary example, the ribbon sheet including at least one of an amorphous alloy and a nanocrystalline alloy may be used as the first shielding sheet 211, and the ferrite sheet may be used as the second shielding sheet 212.

The ferrite sheet has a relatively higher magnetic permeability than that of the ribbon sheet including at least one of an amorphous alloy and a nanocrystalline alloy at the frequency of 13.56 MHz. Thus, in case that NFC is performed, a time-varying magnetic field generated by the high frequency signal of 13.56 MHz generated from an antenna equipped in a radio frequency (RF) reader device may be induced toward the second shielding sheet 212 having a relatively high permeability. Thereby, the NFC antenna 14 disposed on an area corresponding to the second shielding sheet 212 can receive the high frequency signal with high efficiency.

In addition, when the permeability loss rate of the second shielding sheet 212 is lower than that of the first shielding sheet 211, even if the first shielding sheet 211 and the second shielding sheet 212 have the same permeability in the frequency of 13.56 MHz, as a result the loss of permeability according to the permeability loss rate may be reduced when the NFC is performed. Accordingly, the time-varying magnetic field generated by a high frequency signal of 13.56 MHz generated from the antenna equipped in the RF reader device is induced toward the second shielding sheet 212 having a relatively high permeability, so that the NFC antenna 14 disposed over the second shielding sheet 212 can receive the high frequency signal with high efficiency.

Here, it has been described above that the ribbon sheet including at least one of an amorphous alloy and a nanocrystal alloy may be used as the first shielding sheet 211, and the ferrite sheet may be used as the second shielding sheet 212. However, the present disclosure is not limited thereto. The material of the first shielding sheet 211 and the second shielding sheet 212 may be variously changed to other material, as long as the permeability, the saturation magnetic field, and the permeability loss rate of the first and second shielding sheets 211 and 212 satisfy the conditions relative to each other in the corresponding frequency band.

In an exemplary embodiment, the first shielding sheet 211 and the second shielding sheet 212 may be made of the same material having different magnetic permeabilities at the frequency of 350 kHz or less and/or at the frequency of 13.56 MHz. The ferrite sheet may be used as the first shielding sheet 211, and the ribbon sheet including at least one of the amorphous alloy and the nanocrystal alloy may be used as the second shielding sheet 212. This is, because even if they are made of the same material, they can be manufactured to have different characteristics (e.g., in permeability, saturation magnetic field, permeability loss rate, etc.) through change of several conditions such as a heat treatment temperature, number of stacking layers, etc.

In addition, when the ribbon sheet including at least one of the amorphous alloy and the nanocrystal alloy is used as at least one of the first shieling sheet 211 and the second shielding sheet 212, a single-layer ribbon sheet may be used, or a multi-layered ribbon sheet formed by stacking a plurality of ribbon sheets may be used for the first shielding sheet 211 and the second shielding sheet 212 as shown in FIG. 6.

It should be noted that the magnetic field shielding units 100, 200, 200' and 200" according to the exemplary embodiments of the present disclosure can be applied to not only the Qi standard based wireless charging method but also the power matters alliance (PMA) based wireless charging method in which a part of the magnetic force lines generated in the permanent magnet may be induced through an attractor (not shown). In addition, it is noted that the magnetic field shielding units 100, 200, 200' and 200" according to the embodiment of the present disclosure can be also applied to a magnetic resonance method in which wireless charging is performed using a frequency of 6.78 MHz.

For example, the magnetic field shielding unit 100 according to an embodiment of the present disclosure may include the wireless power transmitting module 1 including the shielding unit 100 and the antenna unit 10 as shown in FIGS. 8 and 9.

Here, the wireless power transmission module 1 may be used for a wireless power transmitting device for transmitting the wireless power signal to the electronic device, or may be a wireless power receiving device for receiving a wireless power signal transmitted from the wireless power transmitting device.

In addition, the antenna unit 10 applied to the wireless power transmitting module 1 may use another frequency band to perform another function using other frequency band, in addition to the wireless power transmitting antenna 12. For example, the other antenna may be the MST antenna 13 or the NFC antenna 14, or any other may be the wireless power transmitting antenna using a different frequency band from the wireless power transmitting antenna 12.

As described above, the present disclosure has been described with respect to particularly preferred embodiments. However, the present disclosure is not limited to the above embodiments, and it is possible for one who has an ordinary skill in the art to make various modifications and variations, without departing off the spirit of the present disclosure.

What is claimed is:

1. A magnetic field shielding unit comprising:
a magnetic field shielding sheet, and
a metallic protecting member attached to a surface of the magnetic field shielding sheet via an adhesive layer for protecting the magnetic field shielding sheet in addition to for radiating heat generated from a heat source,
wherein the metallic protecting member includes at least one slit having a predetermined length,
wherein the slit is formed on an area corresponding to a wireless power transmitting antenna for transmitting wireless power,
wherein the slit is formed in a direction perpendicular to a longitudinal direction of a pattern constituting the wireless power transmitting antenna, or in a direction perpendicular to a tangent of a pattern constituting the wireless power transmitting antenna, and
wherein the magnetic field shielding sheet is multi-layered ribbon sheets including at least one of an amorphous alloy and a nanocrystalline alloy.

2. The magnetic field shielding unit of claim 1,
wherein the metallic protecting member is made of a metallic thin film having a thermal conductivity of 200 W/m·K or more.

3. The magnetic field shielding unit of claim 2,
wherein the metallic thin film is aluminum or copper foil.

4. The magnetic field shielding unit of claim 2,
wherein a thickness of the metallic protecting member is 1/9 to 1/3 of a thickness of the magnetic field shielding sheet.

5. The magnetic field shielding unit of claim 1,
wherein the adhesive layer includes a thermal conductive component.

6. The magnetic field shielding unit of claim 1,
wherein the metallic protecting member includes a substrate layer made of a metallic material and a coating layer which is coated for radiation on at least one side of the substrate layer.

7. The magnetic field shielding unit of claim 1,
wherein the magnetic field shielding sheet includes a plurality of fine pieces which are divided.

8. The magnetic field shielding unit of claim 7,
wherein the plurality of fine pieces is entirely or partially insulated between neighboring fine pieces.

9. The magnetic field shielding unit of claim 7,
wherein the plurality of fine pieces has irregular shapes.

10. The magnetic field shielding unit of claim 1,
wherein the magnetic field shielding sheet includes a plurality of sheets having different characteristics in a predetermined frequency band.

* * * * *